United States Patent [19]

Rankin

[11] 4,315,218

[45] Feb. 9, 1982

[54] GASEOUS TUBE CONTROL CIRCUIT

[76] Inventor: John C. Rankin, 908 S. Hobart Blvd., Los Angeles, Calif. 90006

[21] Appl. No.: 84,107

[22] Filed: Oct. 12, 1979

[51] Int. Cl.³ .................. H03K 5/13; H03K 23/22
[52] U.S. Cl. .................................. 328/8; 328/84; 307/252 UA; 307/316; 307/594
[58] Field of Search ............... 328/8, 84, 47, 210, 328/307, 316, 252 UA; 315/DIG. 7; 307/594

[56] References Cited

U.S. PATENT DOCUMENTS

| | | | |
|---|---|---|---|
| 3,298,011 | 1/1967 | Lehnhardt | 307/316 |
| 3,575,612 | 4/1971 | Lunn | 307/316 |
| 4,147,962 | 4/1979 | Engel | 315/DIG. 7 |

Primary Examiner—Stanley D. Miller, Jr.
Assistant Examiner—B. P. Davis

[57] ABSTRACT

A field effect transistor is used to short circuit the timing capacitor of a gaseous tube when power is interrupted or removed. The short circuiting of the timing capacitor prevents the residual capacitor charge from being added to a new charge after an interruption so that the early firing of the gaseous tube is avoided and damage is prevented.

Because capacitor charging always starts at zero voltage when the field effect transistor is used, hysteresis, at low voltage outputs, from the gaseous tubes is greatly improved.

1 Claim, 1 Drawing Figure

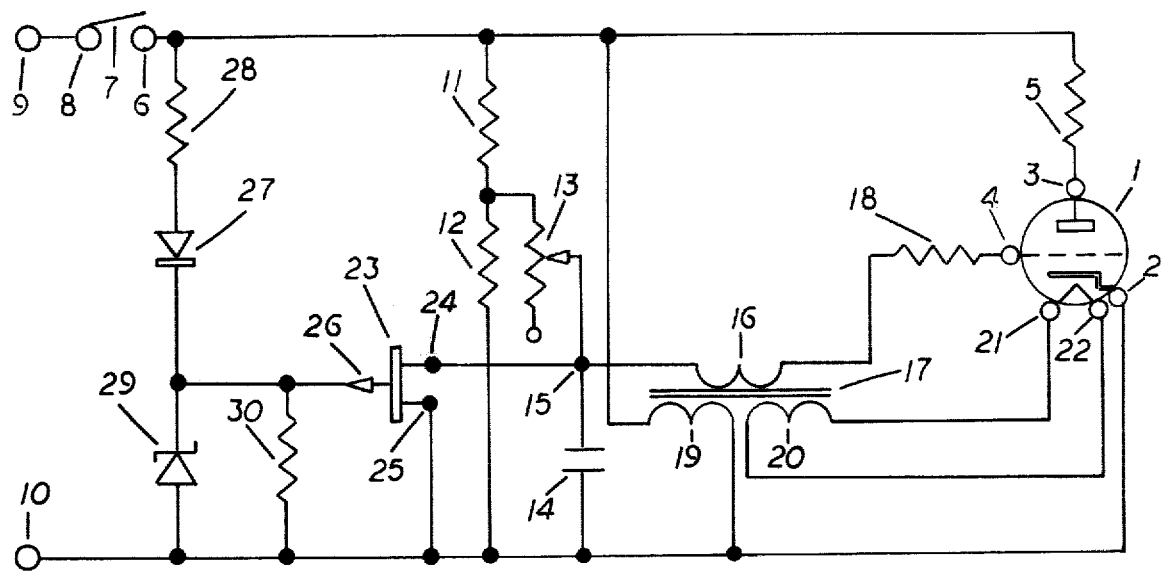

GASEOUS TUBE CONTROL CIRCUIT

SUMMARY OF THE INVENTION

A primary object of the invention is to provide a means of preventing the destruction of equipment when the power supply connected to the timing circuit of a gaseous tube is interupted. This is done by connecting a field effect transistor across the gaseous tube timing capacitor to discharge the capacitor in microseconds after the start of the interruption. Then, when the interuption has ended, the capacitor has no charge and has to begin charging from zero volts until the required triggering point is reached and damage is avoided.

A further object of the invention is to provide a timing circuit which has less hysteresis and greater range of control with few components. Because, with the field effect transistor, the timing capacitor is discharged at the end of each half cycle or zero crossing of the line voltage, the capacitor starts charging at zero voltage which takes a maximum time period to reach the triggering point. This results in the gaseous tube firing at a lower point of the half cycle of the line voltage with lower output voltage available and a minimum of hysteresis.

Line voltage interruptions occur for many reasons such as a momentary short circuit on the power line, the starting of a large motor with a locked rotor or the intermittent on and off connection when the equipment is being switched with certain types of switches. Under these conditions the interuption may last for a period of some milliseconds and because the gaseous tube timing capacitor cannot immediately discharge through the resistor connected in series with the timing capacitor, the timing capacitor will retain most of the charge during the line voltage off period. When power is returned to the equipment, the time normally taken for the capacitor to reach the retained charge, is subtracted from the required time and the gaseous tube fires too early. This type of misfiring is particularly troublesome with gaseous tubes used for welding and in many instances poor welding is blamed on transient spikes instead of momentary dips in line voltage.

BRIEF DESCRIPTION OF THE DRAWING

The sole FIGURE is a schematic showing the fundamentals of the invention with a gaseous tube circuit having a P type field effect transistor connected across the timing capacitor.

DESCRIPTION OF THE PREFERRED EMBODIMENTS

Referring to the sole FIGURE which shows a gaseous tube 1 having a cathode 2, a plate 3 and a grid 4. The plate 3 is connected through a load resistor 5 to contact 6 of switch 7 with contact 8 of switch 7 connected to alternating current supply terminal 9. Cathode 2 is shown connected to alternating current supply terminal 10. With switch 7 closed, voltage is applied through a voltage divider consisting of resistors 11 and 12 to variable resistor 13, to charge capacitor 14 with a voltage present between junction 15 and supply terminal 10. The voltage across capacitor 14 is applied to grid 4 through winding 16 of transformer 17 and limiting resistor 18. Winding 19 is the transformer 17 primary and it is connected between switch contact 6 and supply terminal 10. Winding 20 supplies heater power to terminals 21 and 22 of gaseous tube 1. The voltage across winding 16 supplies negative bias between grid 4 and junction 15, the voltage at the grid 4 end of winding 16, which is induced from the primary winding 19, is always one hundred and eighty degrees out of phase with the voltage on plate 3 and until voltage from variable resistor 13 can charge capacitor 14 to the firing point of grid 4, no current will flow in plate 3 circuit. When the lagging voltage across capacitor 14 does reach the firing point of grid 4, a pulse of current flows between grid 4 and cathode 2. A conductive path then exists between plate 3 and cathode 2 so that a pulse of current flows from supply terminal 9, through load resistor 5, plate 3 and cathode 2 to supply terminal 10. The width of the pulse flowing in the plate 3 circuit is set by the variable resistor 13.

The P type field effect transistor 23 has the drain 24 connected to junction 15 and the source 25 is connected to the supply terminal 10 so that without a positive voltage applied between gate 26 and source 25, the field effect transistor 23 appears as a low resistance across capacitor 14. Alternating current voltage at switch contact 6 is rectified by rectifier 27, current limited through resistor 28 and applied to zener diode 29. Resistor 30 is a load resistor across zener diode 29 and also serves to reduce resistance between gate 26 and source 25.

During the previously described charge and discharge cycle of capacitor 14, resulting in a pulse of current in the circuit of plate 3, field effect transistor 23 was acting as if it were not in the circuit because a flat topped positive pulse across zener diode 29 was applied between gate 26 and source 25 to provide a high resistance between drain 24 and source 25. When the voltage between supply terminal 9 and 10 goes through zero crossing, the voltage across zener diode 29 becomes zero and the resistance between drain 24 and source 25 drops to the vicinity of three hundred ohms and discharges capacitor 14. The low resistance of field effect transistor 23 remains across capacitor 14 during the negative half cycle until the following zero crossing when the charge cycle is repeated.

If the field effect transistor were removed from the circuit of the FIGURE and the switch 7 placed in the closed position and then quickly opened and closed again, the interuption would duplicate a sudden short circuit on the supply line and the charge on capacitor 14 would remain with very little change. If the switch 7 had been opened just before the charge on capacitor 14 had reached the firing voltage of grid 4 and then, when switch 7 was finally closed the positive half cycle at supply terminals 9 and 10 was just commencing, the gaseous tube 1 would fire very early in the cycle, possibly sooner than required. If the field effect transistor 23 had been connected during the interuption, the capacitor 14 would have been discharged immediately the switch 7 was opened and the recharging would have started with the capacitor 14 empty and no misfiring would have occurred.

The load resistor 5 may be replaced by a welding transformer and bad welding caused by short duration line interuptions can be prevented by the use of the field effect transistor 23.

While particular embodiments of the present invention have been shown and described, it is apparent that various changes and modifications may be made. For example, additional tubes used as amplifiers, following the timing tube may be incorporated. Also, since in physics the word vapor is a term used to designate the gaseous form which a solid or liquid may assume when heated, tubes using mercury and other vapors are considered to come under the heading of gaseous tubes. Accordingly the above description is illustrative of principles of the present invention and numerous modifications thereof may be devised by those skilled in the art without departing from the spirit and scope of the invention.

What is claimed is:

1. A gaseous tube control circuit comprising:

a bias voltage applied between grid and cathode of said gaseous tube to prevent current flow between plate and said cathode in the absence of an initial firing voltage applied between said grid and said cathode;

a timing circuit for firing said gaseous tube consisting of a resistor and a capacitor;

a source of alternating current pulses having a first and second output terminal with said first output terminal effectively connected to said plate and said second output terminal effectively connected to said cathode;

the first lead of said resistor connected to the first output terminal of said source of alternating current pulses;

the second lead of said resistor connected to the first lead of said capacitor to form a junction and the second lead of said capacitor connected to the said second terminal of said source of alternating current pulses;

means for connecting said junction to said grid and said second lead of said capacitor to said cathode;

a field effect transistor having the drain effectively connected to said first lead of said capacitor and the source connected to said second lead of said capacitor;

means for applying voltage pulses between the gate and said source of said field effect transistor so that the resistance between said drain and said source is high to allow charging of said capacitor through said resistor with the voltage polarity required to fire said grid of said gaseous tube and so that the resistance between said drain and said source is low to discharge said capacitor when said alternating current pulses are at and passing through zero amplitude.

* * * * *